United States Patent [19]
Saitoh et al.

[11] Patent Number: 5,250,506
[45] Date of Patent: Oct. 5, 1993

[54] SUPERCONDUCTIVE SWITCHING ELEMENT WITH SEMICONDUCTOR CHANNEL

[75] Inventors: Shinichiroh Saitoh, Tokyo; Yoshinobu Tarutani, Yamanashi; Tokuumi Fukazawa; Masahiko Hiratani, both of Tokyo; Toshikazu Nishino, Kanagawa; Haruhiro Hasegawa, Tokyo; Ushio Kawabe, Tokyo; Kazumasa Takagi, Tokyo; Mitsuo Suga, Tokyo, all of Japan

[73] Assignee: Hitachi, Ltd., Tokyo, Japan

[21] Appl. No.: 647,234

[22] Filed: Jan. 29, 1991

[30] Foreign Application Priority Data

Feb. 2, 1990 [JP] Japan .................... 2-21983

[51] Int. Cl.$^5$ .................... H01L 39/22; B05D 5/12; H01B 12/00
[52] U.S. Cl. .................................. 505/1
[58] Field of Search ............ 357/5, 4; 505/1, 702, 505/832, 874; 427/62, 63; 257/33, 35, 39

[56] References Cited

U.S. PATENT DOCUMENTS

| | | | |
|---|---|---|---|
| 3,500,137 | 3/1970 | Schroen et al. | 357/5 |
| 4,888,629 | 12/1989 | Harada et al. | 357/5 |
| 4,948,779 | 8/1990 | Keur et al. | 357/5 |
| 4,983,573 | 1/1991 | Bolt et al. | 427/62 |
| 5,087,605 | 2/1992 | Hedge et al. | 357/5 |

FOREIGN PATENT DOCUMENTS 01268075 10/1989 Japan .

OTHER PUBLICATIONS

Ohshima et al, "Superconducting and Structural Properties of the New BaLnCuO Compound System . . . ", Jap. J of Appl. Phys., vol. 26, #5, May, 1987 pp. L815–L817.
Bordet et al, "Crystal Structure of $Y_{0.9}Ba_{2.1}Cu_3O_6$, A Compound Related to the High-Tc Superconductor $YBa_2Cu_3O_7$", Nature, vol. 327, 25 Jun. 1987, pp. 687–689.
Herman et al, "Electric Structure of Oxygen-Deficient High-Tc Superconductors: $YBa_2Cu_3O_x(6 \leq x \leq 8)$", IBM Research Submitted to Solid State Physics, 1987.
Poppe et al, "Epitaxial Multilayers of $YBa_2Cu_3O_7$ and $PrBa_2Cu_3O_7$ as a Possible Basic for Superconducting Electron Devices", Solid State Communications, vol. 71, #7, pp. 569–572, 1989.
"Rare-Earth Doping of High Tc Superconducting Perovskites", McKinnon et al, Proceedings of Symp. S., MRS, Apr. 1987, pp. 185–187.
"Formation of $YBa_2Cu_3O_7$ Superconducting Films by Ion Implantation", Nastasi et al, Appl. Phys. lett., vol. 52, #20, 5 May 1988 pp. 1729–1731.
"Monolithic Device Fabrication Using High-Tc Superconductor", Yoshida et al, Int'l Electron Devices Meeting, Dec. 1988 pp. 282-IEDM 88–285-IEDM 88.
"$a$-axis Oriented Epitaxial $YBa_2Cu_3O_{7-x}$–Pr $Ba_2Ca_3O_{7-y}$ Heterostructures", Inam et al. Appl. Phys. Lett., vol. 57, #23, 3 Dec. 1990 pp. 2484–2486.
Appl. Phys. Lett. 55 (19), 6 Nov. 1989, American Institute of PHysics, pp. 2032–2034: Fabrication of heteroepitaxial $YBa_2Cu_3O_{7-x}$–$PrBa_2Cu_3O_{7-x}$–$YBa_2CU_3O_{7-x}$ Josephson devices grown by laser deposition.
Physical Review Letters, vol. 54, No. 22, 3 Jun. 1985; The American Physical Society, pp. 2449–2452: Superconducting Proximity Effect in the Native Inversion Layer on InAs.

Primary Examiner—Rolf Hille
Assistant Examiner—Mahshid Saadat
Attorney, Agent, or Firm—Kenyon & Kenyon

[57] ABSTRACT

A superconductive element at least comprising first and second superconductive electrodes composed of an oxide superconductor material and a semiconductor film composed of an oxide semiconductor material put between the first and second superconductive electrodes and disposed in adjacent with the first and the second superconductive electrodes, in which the semiconductor film is formed with an oxide comprising rare earth elements other than Pr, Ba and Cu as the main ingredient element or an oxide comprising predetermined amount of rare earth elements other than Pr, predetermined amount of Pr, Ba and Cu as the main ingredient element. Extremely fine size is no more necessary to enable fabrication with the existent fine fabrication technic.

13 Claims, 3 Drawing Sheets

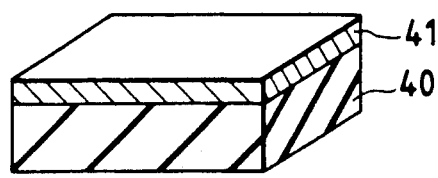
FIG. 6a
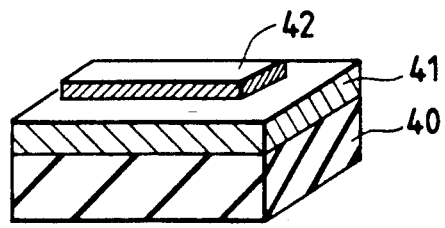
FIG. 6b
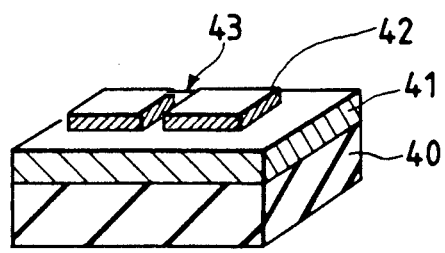
FIG. 6c
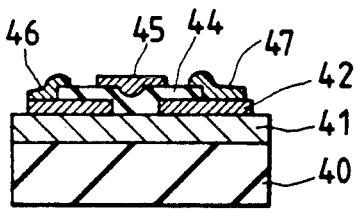
FIG. 6d
FIG. 7
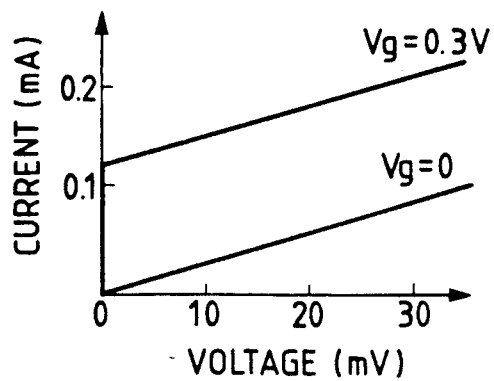

SUPERCONDUCTIVE SWITCHING ELEMENT WITH SEMICONDUCTOR CHANNEL

BACKGROUND OF THE INVENTION

1. Field of the Invention

The present invention concerns a superconductive element for conducting switching operation and, more in particular, it relates to a superconductive element using an oxide superconductor and an oxide semiconductor.

2. Description of Related Art

A field effect superconductive 3-terminal device has advantageous features, as compared with a Josephson junction device in that input-output isolation is satisfactory, switching can be conducted by a voltage signal and it can be driven by a DC power source. A field effect type superconductive 3-terminal device composed of Nb-based superconductor and Si or InAs semiconductor operating at a liquid helium temperature is described, as an example, in Physical Review Letters, Vol. 54, p. 2449, 1985. The device has such a structure that a source electrode and a drain electrode comprising a superconductor thin film are disposed on a semiconductor substrate and a gate electrode is inserted therebetween. A supercurrent penetrates from the source electrode into the semiconductor substrate by a superconducting proximity effect and flows to the drain electrode passing through the semiconductor substrate. The super current is controlled by a voltage applied to the gate electrode.

When the field effect superconducting 3-terminal device is manufactured with an oxide superconductor having a high superconducting transition temperature, the operation temperature can be made higher and a high speed operation can be expected due to the high superconducting transition temperature. However, upon actually obtaining such a device, there are the following technical problems.

When a thin film of an oxide superconductor is formed, an oxide is more desirable than Si, InAs or like other material as the semiconductor material for preventing the degradation of superconducting characteristics and reducing the contact resistance with the semiconductor, because an oxide insulation layer such as of $SiO_x$ is formed on the surface of Si or the characteristics of the oxide superconductor are deteriorated due to the reaction between Si and the compound semiconductor. A greater effect capable of suppressing such reactions can be obtained by using an oxide semiconductor layer, in particular, an oxide containing copper like that in the superconductor as the oxide superconductor layer.

However, in the oxide semiconductor, electron or hall mobility is as low as the order of 0.01 m$^2$/V.s. In the case of using an oxide semiconductor with such a low mobility, the coherence length is shortened, and it is further shortened in a case of operation at a liquid nitrogen temperature. In view of the above, the channel length has to be shortened further as compared with a conventional device using a metal superconductor.

However, it is extremely difficult to form a pattern of less than 0.1 μm and, further, form a gate therein even with the modern pattern forming technology.

Furthermore, in a case of forming a superconductive element conducting the switching operation between the superconducting state and the normal state by using an oxide capable of exhibiting superconductivity at a high critical temperature as described above, the oxide semiconductor or oxide semiconductor employed brings about problems.

That is, there have been proposed a superconductive switching device using a crystal grain boundary of an oxide superconductor as a weak link, or a superconductive element comprising an oxide superconductor layer and a noble metal, for example, Au in contact with each other and a superconductive element using a YBa$_2$Cu$_3$O$_{7-x}$ film and PrBa$_2$Cu$_3$O$_{7-x}$ as an oxide superconductor film and an oxide semiconductor film respectively in, for example, Applied Physics letters Vol. 55, pp. 2032–2034 (for instance, ternary oxides of Y, Ba and Cu such as Y Ba$_2$Cu$_3$O$_{7-x}$ are collectively referred to as Y-Ba-Cu-O, while ternary oxides of Pr, Ba and Cu such as PrBa$_2$Cu$_3$O$_{7-x}$ are collectively referred to as Pr-Ba-Cu-O in the present specification).

This example has a structure in which a Pr-Ba-Cu-O film of about 50 nm thickness is put between two Y-Ba-Cu-O films. That is, a laminate structure of Y-Ba-Cu-O film/Pr-Ba-Cu-O/Y-Ba-Cu-O film is formed and Josephson junction characteristics are obtained with the structure described above.

However, the superconductive element as described above involves the following problems and it is difficult to apply, in particular, to superconductive 3-terminal devices.

That is, although Pr-Ba-Cu-O has an identical crystal structure with Y-Ba-Cu-O, it does not exhibit superconductivity. In R-Ba-Cu-O, if the element R in the site for Y or Pr atom is a ferromagnetic element such as Eu or Gd, R-Ba-Cu-O exhibits superconductivity with a critical temperature at 90K. However, Pr-Ba-Cu-O using Pr as R does not show superconductivity, because the magnetic interference of Pr atoms prevails over a long distance and it reaches as far as Cu-O atom plane as an electroconducting plane.

Accordingly, in a case of using Pr-Ba-Cu-O as a coupling material for a weak link device (semiconductor layer) or a normal conductive layer, the superconductive electron density is remarkably lowered at the inside of Pr-Ba-Cu-O due to the magnetic interference. Accordingly, the distance between superconductive electrodes required for the superconductive weak link device has to be decreased extremely.

In a case of a superconducting three-terminal device, if the distance between superconductive electrodes, that is, the semiconductor channel length is extremely shortened, it is difficult to form a superconductive element. For instance, in a case of a 3-terminal device which controls the supercurrent by means of the electric field effect, a gate electrode is required for applying the electric field. However, it is extremely difficult to apply the structure of a usual field effect transistor using silicon or the like in which a gate is disposed between a source electrode and a drain electrodes, to a superconducting 3-terminal device.

SUMMARY OF THE INVENTION

The object of the present invention is to overcome the foregoing problems in the prior art and to provide a superconductive element capable of controlling a desired supercurrent easily without requiring the formation of an extremely fine pattern.

Another object of the present invention is to provide a superconductive element with no worry for remarkable reduction of superconductive electron density.

For attaining the foregoing objects, a film of material having an oxide containing La, Ba and Cu and having a crystal structure similar to that of an oxide superconductor as the oxide semiconductor film in the present invention. Such a material is represented as La-Ba-Cu-O as described above. One of the examples is $La_{1.5}Ba_{1.5}Cu_3O_y$: ($6.8 \leq y \leq 7.2$.). The basic form of the crystal structure is identical with that of R-Ba-Cu-O in which R represents rare earth clement, and the ratio La/Ba is set to about less than 1.2. If the ratio is greater than 1.2, the elements are separated into two phases and not constitute a single phase compound.

As the oxide superconductor film, there is used a film comprising an oxide of rare earth element including Y (except for Pr), Ba and Cu, that is, material represented by R-Ba-Cu-O in which R represents a rare earth element except for Pr, for example, $Y_1Ba_2Cu_3O_{7-x}$.

The element may have such a structure, for example, as shown in FIG. 1, in which two oxide superconductor films 3 and 4 are disposed at a predetermined gap on an oxide semiconductor film 2 and, further, a controlling gate electrode 6 is disposed on an insulation film 5. Thus, 3-terminal superconducting device is formed. Further, there may be used a structure, as shown in FIG. 2, in which two oxide superconductor films 8 and 10 and an oxide semiconductor film are laminated. It will be apparent that an electrode is disposed to each of the two oxide superconductor films in this case.

Further, by using the superconductive elements described above as circuit elements, a circuit device having superconductive logic function or memory function can be obtained.

BRIEF DESCRIPTION OF THE DRAWINGS

FIGS. 6a–6d are views illustrating manufacturing step for a further embodiment according to the present invention; and FIG. 7 is a graph illustrating one example of characteristics of the superconductive element according to the present invention.

DETAILED DESCRIPTION

Example 1

Figure 1:
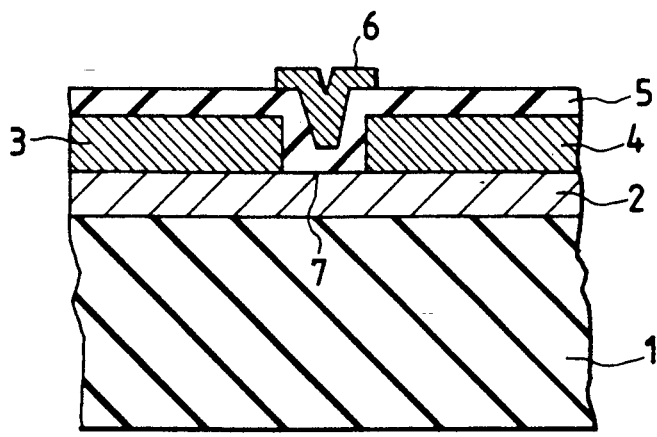
FIG. 1 is a cross sectional view for explaining a preferred embodiment according to the present invention.

FIG. 1 shows a cross sectional structure of a field effect superconductive element, in which a superconductor layer is formed with a Y-Ba-Cu-O film and a semiconductor layer is formed with La-Ba-Cu-O film respectively.

At first, a $La_{1.5}Ba_{1.5}Cu_3O_y$ film 2 ($6.8 \leq y \leq 7.2$) of 200 nm thickness was formed on the entire main surface of $SrTiO_3$ (110) single crystalline substrate 1.

Then, a $Y_1Ba_2Cu_3O_{7-x}$ film ($0 \leq X \leq 0.5$) of 300 nm thickness was formed and unnecessary portion was removed by reactive ion beam etching using $SF_6$ as an etching gas, thereby forming a source 3 and a drain 4. The gap between the source 3 and the drain 4, that is, the length of a channel 7 was set to 100 nn. After forming an $SrTiO_3$ film 5 of 100 nm thickness and a $Y_1Ba_2Cu_3O_{7-x}$ film 6 ($0 \leq X \leq 0.5$) of 100 nm thickness, unnecessary portion of the Y-Ba-Cu-O film 6 was removed by reactive ion beam etching using $SF_6$ as an etching gas, to form a gate electrode 6. All of the Y-Ba-Cu-O films 3, 4 and 6, the La-Ba-Cu-O film 2 and the $SrTiO_3$ film 5 were formed by means of RF sputtering. The sputtering was applied under the conditions as below. Atmospheric gas: 50/50 gas mixture of Ar and oxygen, total pressure: 50 mTorr, substrate temperature: 600° C., power source frequency: 13.5 MHz, power: 100 W. Disk-shaped sintered oxide having the same composition as each of the films was used as the target.

It was recognized, in the $La_{1.5}Ba_{1.5}Cu_3O_y$ film 2 formed under such conditions, that the c axis of tetragonal crystals had a crystallographic orientation in parallel with the substrate surface, and b axis had an angle of 45 relative to the substrate surface. The $Y_1Ba_2Cu_3O_{7-x}$ films 3 and 4 had similar crystal structure to that of the $La_{1.5}Ba_{1.5}Cu_3O_{7-x}$ film 3 and identical crystallographic orientation. In the $SrTiO_3$ thin film 5, the (110) face was grown in parallel with the main surface of the substrate 1. The superconducting critical temperature of the $Y_1Ba_2Cu_3O_{7-x}$ films 2 and 3 was about 70K.

When measuring the current/voltage characteristics of the superconductive element formed by the above-mentioned steps, about 1 mA of supercurrent was caused to flow and a voltage was generated for a bias current greater than that. Further, when 3 V of voltage was applied to the gate electrode 6, the supercurrent was reduced to 0.5 mA, and a voltage was generated under a greater bias current. As has been described above, it has been confirmed that the superconductive element according to the present invention has fundamental characteristics as a 3-terminal device.

Example 2

Figure 2:
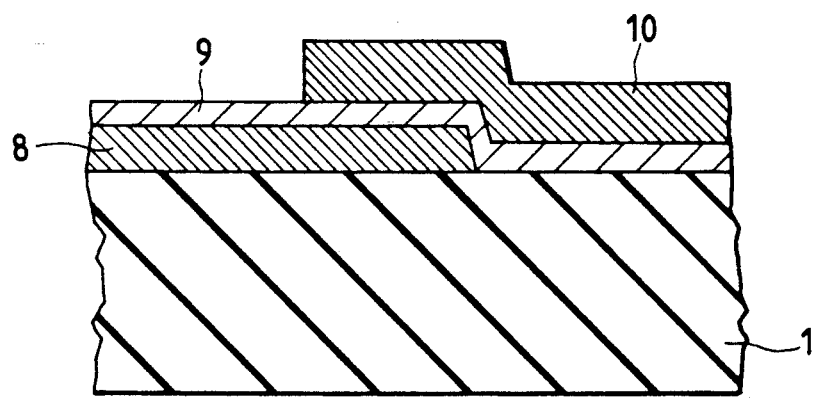
FIGS. 2 and 3 are, respectively, a cross sectional view and a plan view for explaining another embodiment according to the present invention.

As shown in FIG. 2, a $Y_{1.0}Ba_2Cu_3O_{7-x}$ film 8 ($0 \leq X \leq 0.5$) Of 200 nm thickness was formed on the main surface of a $SrTiO_3$ (110) single crystalline substrate 1 in the same manner as in Example 1 by using magnetron sputtering. Subsequently, a $La_{1.5}Ba_{1.5}Cu_3O_y$ film 9 ($6.8 \leq y \leq 7.2$) of 80 nm thickness was formed in the same manner by means of magnetron sputtering. The La-Ba-Cu-O film 9 was formed in the same sputtering device as that for the Y-Ba-Cu-O film 8 so that the surface of the latter was not exposed to air.

It was observed that the thus formed La-Ba-Cu-O film 9 had the same crystal structure and the same crystallographic orientation as those of the Y-Ba-Cu-O film 8.

Further, a Y-Ba-Cu-O film 10 of 400 nm thickness as the upper electrode was formed in the same manner in the same sputtering device as that for the La-Ba-Cu-O film 9 as the underlying layer such that the surface of the latter is not exposed to air. In this way, degradation of the coupling of superconductivity caused by the presence of impurities at the boundary between each of the films could be obtained.

Figure 3:
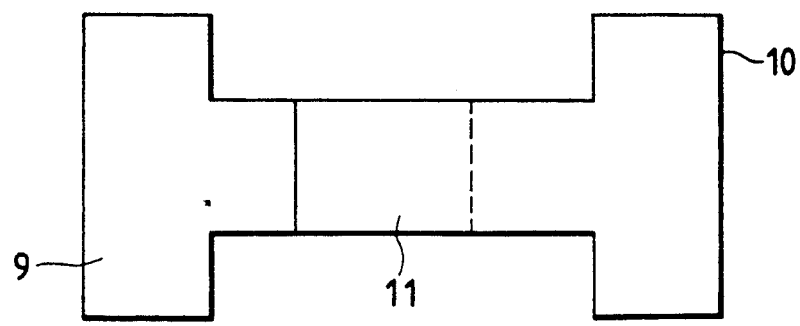

Unnecessary portion of the three-layered film having a structure of Y-Ba-Cu-O film 10/La-Ba-Cu-O film 9/Y-Ba-Cu-O film 8 thus formed was removed to form a weak link superconductive element having a structure in which the Y-Ba-Cu-O film 10 and the Y-Ba-Cu-O film 8 were overlapped in the region 11 as shown in FIG. 2 and FIG. 3 showing a cross sectional structure and a plane structure respectively. The unnecessary portion of the 3-layered film was removed by reactive ion beam etching. The etching conditions were as follows: etching gas: $SF_6$, acceleration voltage: 500 V, and gas pressure: 0.2 mTorr.

Figure 4:
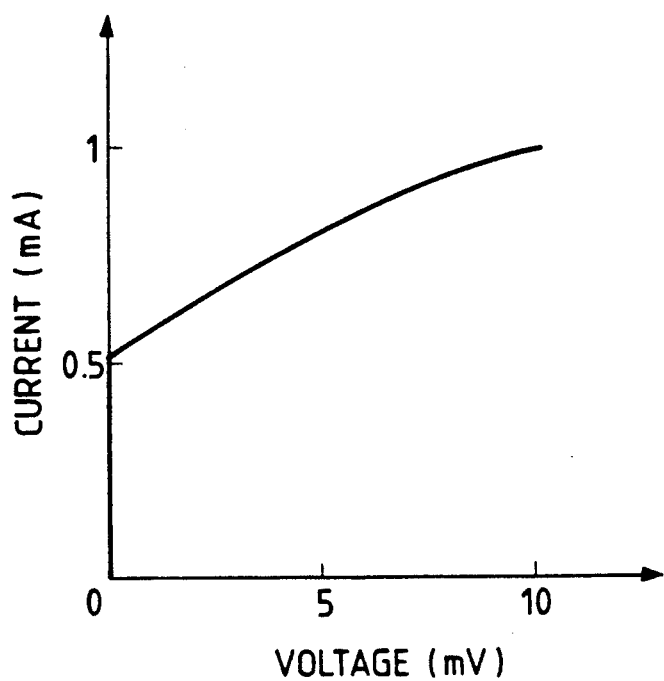
FIG. 4 is a graph illustrating one example of voltage-current characteristics of a superconductive element according to the present invention.

FIG. 4 shows the characteristics of the superconductive element manufactured by the above-mentioned method. About 0.5 mA of supercurrent was caused to flow and a voltage was generated at a bias current in excess of 0.5 mA. For determining whether the supercurrent was caused by interelectrode short-circuiting or it was a Josephson current due to phase shifting, when voltage/current characteristics were measured while irradiating a microwave of 9.5 GHz frequency to the element, steps of current were observed on every 20 $\mu V$ of the voltage value. This means that the supercurrent is a Josephson current accompanying the phase change.

Example 3

Figure 5:
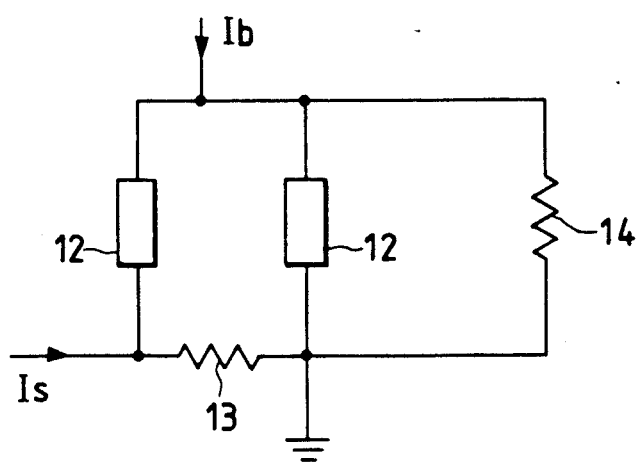
FIG. 5 is a view illustrating a switching gate circuit constituted with the superconductive element according to the present invention.

This example concerns a fundamental switching gate constituted by the combination of superconductive elements according to the present invention as described above, in which the gate is constituted with the weak link superconductive device shown in Example 2. The constitution of the gate is shown in FIG. 5. That is, OR switching gate was formed by connecting two superconductive elements 12 and a resistor 13. A load resistor 14 was disposed in parallel with the switching gate. The load resistor 14 was formed with a Pt film by means of electron beam vapor deposition. The superconductive element 12 and the Y-Ba-Cu-O superconductive wiring were formed by the method shown in Examples 1 and 2.

The operation characteristics of the OR switching gate are as shown below. That is, when a signal current was applied to the electrode in a state of supplying a bias current at 0.3 mA, if the signal current is kept lower than 0.2 mA, the gate electrode was kept at 0 voltage and no voltage was generated between both ends of the load resistor. Then, when the signal current was further increased, a voltage was generated on the gate and a voltage was detected on both ends of the load resistor 14. As described above, it was confirmed that the present gate was operated as an OR switching gate.

The switching gate can be constituted not only with the superconductive element shown in Example 2 but also with the field effect superconductive element shown in Example 1. In this case, only one element is necessary.

It will be apparent that an AND gate can also be constituted by using the superconductive element according to the present invention, and a logic circuit can also be constituted with ease by the combination of such OR and AND switching gates. Further, a memory device can also be constituted by combining a superconductive element and a superconductive loop.

In each of the examples described above, La was used as R in $R_{1.5}Ba_{1.5}Cu_3O_y$ $(6.8 \leq y \leq 7.2)$.

However, according to the studies of the present inventor, it was found that R-Ba-Cu-O in which a portion of Pr as R is replaced with a predetermined amount of a rare earth element can be used and that characteristics as the semiconductor are shown if R increased to make R:Ba ratio greater than 1.3:1.7. That is, those containing Pr at a ratio of 0.6–0.7 to 0.3–0.4 of rare earth element such as Y can be used for R.

Further, it was also found that $Nd_{1.5}Ba_{1.5}Cu_3O_y$ using Nd as R in the same $R_{1.5}Ba_{1.5}Cu_3O_y$ as in the previous example can be used as the semiconductor film. When such a film is used as the semiconductor film, it was observed that a supercurrent flowed, for example, between superconductive electrodes of $YBa_2Cu_3O_{7-x}$ disposed in adjacent with both Aides of the film, even if the film thickness was as large as about 1 $\mu m$ by using the film as the semiconductor film.

Example 4

A $Nd_{1.5}Ba_{1.5}Cu_3O_y$ film 41 $(6.8 \leq y \leq 7.2)$ of 0.7 $\mu m$ thickness was formed by means of magnetron sputtering on the mirror-polished main surface of $SrTiO_3$ single crystal substrate 40 as shown in FIG. 6a. In this case, the temperature of the substrate 40 was kept at 700° C. Then, as shown in FIG. 6b, a bar-shaped $YBa_2Cu_3O_{7-x}$ film 42 $(0 \leq x \leq 0.5)$ of 0.2 $\mu m$ thickness and 0.1 mm × 5 mm size was formed thereover by means of vapor deposition using a metal mask under the same conditions.

After forming an electron ray resist film over the entire surface, a linear resist pattern of 0.1 $\mu m$ width was formed in parallel with the side of 0.1 mm width on the central portion of the $YBa_2Cu_3O_{7-x}$ film by using an electron beam exposure equipment. An exposed portion of the $YBa_2Cu_3O_{7-x}$ film 41 was etched by using the resist pattern as the mask to form a groove-shaped pattern 43 as shown in FIG. 6c.

Then, as shown in FIG. 6d, a $SrTiO_3$ film 44 of 0.2 $\mu m$ thickness was formed by using sputtering to form a gate insulation film. After forming an Au film over the entire surface, unnecessary portion was removed to form a gate electrode 45, a source electrode 46 and a drain electrode 47 thereby forming a superconductive 3-terminal device.

Gate voltage dependency of the current/voltage characteristics between the source electrode and the drain electrodes was measured at the temperature of liquid helium and liquid nitrogen. The results obtained are shown in FIG. 7. A supercurrent flowed between the source electrode and the drain electrode by the application of the voltage to the gate, and it was confirmed that the extent thereof can be controlled by the gate voltage.

Example 5

In Example 4, the width for the channel 43 was set to 0.3 $\mu m$. As a result, for the gate voltage dependency of current-voltage characteristics between the source electrode and the drain electrodes measured, it was indicated that great reduction was observed for the supercurrent at a temperature of liquid nitrogen, but that the supercurrent was caused to flow by the application of the voltage to the gate under other conditions.

Further, the width for the channel 43 was changed to 0.5 $\mu m$ and 1 $\mu m$. As a result, it was observed that although the supercurrent did not flow at the temperature of liquid nitrogen even if a voltage at 200 mV was applied to the gate, the supercurrent was caused to flow at the liquid helium temperature by the application of the voltage to the gate. The relationship for the controllability obtained from the channel length, the temperature and the gate voltage are collectively shown in Table 1.

TABLE 1

| Channel length | Controllability | |
|---|---|---|
| | Liquid helium temperature | Liquid nitrogen temperature |
| 0.1 $\mu m$ | ◯ | ◯ |
| 0.3 | ◯ | △ |

TABLE 1-continued

| Channel length | Controllability | |
|---|---|---|
| | Liquid helium temperature | Liquid nitrogen temperature |
| 0.5 | ○ | Δ |
| 1.0 | ○ | x |

○ ... supercurrent was sufficiently large to enable element formation
Δ ... supercurrent was low to make element formation difficult
x ... supercurrent could not be detected

Example 6

The oxide semiconductor layer was changed to $Nd_{1.3}Ba_{1.7}Cu_3O$ in Example 4. In this case, although the gate voltage dependency of the current-voltage characteristics between the source and the drawn electrodes was reduced at the liquid helium temperature, a supercurrent was caused to flow and, even if the width of the channel 43 was set to 0.3 μm, the supercurrent still flowed by the application of voltage to the gate electrode.

Example 7

A $La_{1.5}Ba_{1.5}Cu_3O_y$ film was used as the oxide semiconductor layer in Example 4. The same result was obtained in this case for the relationship of the channel length, the temperature and the gate voltage as those in the case of using $Nd_{1.5}Ba_{1.5}Cu_3O_y$ (Table 1).

Example 8

Each of the films was formed while lowering the temperature for the substrate to 600° C. in Example 4. Also in this case, the superconductive film exhibited superconductive characteristics just after forming the film. Further, the current/voltage characteristics between the source electrode and the drain electrode in the thus manufactured device showed a tendency of reducing the supercurrent. This is considered that there was less composition fluctuation in the oxide semiconductor layer and the superconductive portion was reduced because of the lowering of the substrate temperature. On the other hand, when the substrate temperature was elevated to 750° C. upon forming the film, reactions occurred at the boundary between the semiconductor layer and the superconductor film, and the film flatness was degraded, making it impossible for fine fabrication and reducing the translation temperature of the superconductor film.

Example 9

Each of the films was formed while lowering the temperature for the substrate to 500° C. in Example 4. Also in this case, the superconductor film exhibited superconducting characteristics just after the formation of the film, but the supercurrent was further reduced compared with the case of Example 8 regarding the current/voltage characteristics between the source electrode and the drain electrode. In an element with the channel length of greater than 0.5 μm, no supercurrent flowed under the gate voltage of 300 mV at the liquid nitrogen temperature.

Example 10

An element was manufactured by applying a heat treatment at 600° C. for one hour in oxygen to a film formed under temperature conditions shown in Example 8. The current-voltage characteristics between the source electrode and the drain electrode of the element were the same as those obtained in Example 7.

Example 11

A 3-terminal device was formed under the same conditions as those in Example 4 except for using $(Y_{0.4}Pr_{0.6})_{1.5}Ba_{1.5}Cu_3O_y$ as the material for the oxide semiconductor layer. It was confirmed also in this example that the supercurrent flowed between the source electrode and the drain electrode under the application of the gate voltage and the operation as a superconducting 3-terminal device was confirmed. The relationship for the channel length, the temperature and the gate voltage was shown in Table 2 in the same manner as in the case of using $Nd_{1.5}Ba_{1.5}Cu_3O_y$.

The effect of the substrate temperature was the same as in the case of the $Nd_{1.5}Ba_{1.5}Cu_3O_y$ semiconductor thin film.

TABLE 2

| Channel length | Controllability | |
|---|---|---|
| | Liquid helium temperature | Liquid nitrogen temperature |
| 0.1 μm | ○ | ○ |
| 0.3 | ○ | Δ |
| 0.5 | ○ | x |
| 1.0 | ○ | x |

Example 12

An element was formed under the same conditions as those in Example 10 except for using $(Y_{0.3}Pr_{0.7})_{1.5}Ba_{1.5}Cu_3O_y$ as the material for the oxide semiconductor layer. Also in this example, the supercurrent flowed between the source electrode and the drain electrode under the application of the gate voltage and the operation as the superconductive 3-terminal device could be confirmed. It was recognized that the supercurrent tended to be decreased as compared with the case of using $(Y_{0.4}Pr_{0.6})_{1.5}Ba_{1.5}Cu_3O_y$.

Example 13

An element was formed under the same conditions as those in Example 1 except for using $(Nd_{0.3}Pr_{0.7})_{1.5}Ba_{1.5}Cu_3O_y$ as the material for the oxide semiconductor layer. Also in this example, the supercurrent flowed between the source electrode and the drain electrode under the application of the gate voltage and the operation as the superconductive 3-terminal device could be confirmed.

Example 14

A single crystal substrate of magnesium oxide (MgO) with (100) face direction finished to a non-strain mirror polished state was used as a single crystal substrate in Example 4, on which $Y_{0.4}Pr_{0.6}Ba_2Cu_3O_y$ film was formed by using magnetron sputtering. A film was formed while keeping the temperature of the substrate at 600° C. for conducting epitaxial growing. The film thickness was set to 0.7 μm as in Example 4, over which a bar-shaped $YBa_2Cu_3O_{7-x}$ film was formed under the same film-forming conditions by metal mask vapor deposition. The $YBa_2Cu_3O_{7-x}$ film had 0.2 μm thickness and 0.1 mm × 5 mm size. An element was manufactured by the same steps as those in Example 4. The gate voltage dependency of current/voltage characteristics between the source electrode and the drain electrode of the resultant element were measured at the liquid helium temperature and the liquid nitrogen temperature respectively. A supercurrent flowed between the source electrode and the drain electrode under the voltage application to the gate and it was shown that the current could be controlled by the gate voltage. However, the value of the supercurrent was one-third of that in the case of using a single crystal substrate of strontium titanate (SrTiO$_3$) with (110) face direction. It is considered that the c axis of the super conductor film is within the surface of the film in a case of the single crystal substrate of strontium titanate (SrTiO$_3$) with (110) face direction, whereas the c axis is perpendicular to the film surface in the single crystal substrate of magnesium oxide (MgO) with (100) face direction and, thus, there was an effect of the crystallographic orientation.

As apparent from the foregoing descriptions, in accordance with the present invention, the size of the element using the oxide superconductor can be made such that it can be formed without requiring extremely fine fabrication technique but by the existent fine fabrication technique.

Accordingly, it is possible to form a superconductive weak link device and a field effect superconductive device by using an oxide superconductor, as well as it is possible to constitute a superconductive logic circuit and a memory circuit by using the element as described above.

It is indeed a remarkable effect that the superconductive weak link device and a superconductive 3-terminal device can be formed by using the oxide superconductor through the existent fine fabrication technique and this enables to use the superconductive element at higher temperature which could not be used so far only at the liquid helium temperature. Further, since the oxide semiconductor is used for the channel layer, there is no worry that reactions occur between the superconductive electrode and the semiconductor channel, which reduces the degradation of the supercurrent due to the reaction layer and leads to the increase of the gain. For the method of forming the channel layer as a mixed structure of the semiconductor phase and the superconductor phase, there is a method of laminating a superconductor face and a semiconductor phase alternately. In this case, however, it is difficult to form a fine laminate structure perpendicular to the following direction of the current. On the other hand, in the present invention, since the fluctuation of the composition can be adjusted by controlling the temperature in the process including the formation of the thin film, the conventional film-forming method is applicable and this is practically advantageous.

Although sputtering is used in the above-mentioned examples, the oxide superconductor film can be formed not only by the sputtering but also by any other optional method such as reactive vapor deposition, laser abrasion, and the like. Furthermore, as the composition for the oxide superconductor film, R for rare earth element can be substituted with other rare earth elements and yttrium (Y), and barium (Ba) can be substituted with other alkaline earth elements, in addition to the composition shown in the examples.

We claim:

1. A superconductive device comprising:
    first and second superconductive electrodes each composed of an oxide superconductor material and
    a semiconductor film composed of an oxide semiconductor material interposed in the current path between said first and second superconductive electrodes adjacent to said first and second superconductive electrodes, said current path defining a channel having a length between 0.1 and 1.0 microns, wherein
    said oxide superconductor material has the formula RBa$_2$Cu$_3$O$_{7-x}$ where R represents a rare earth element and $0 \leq X \leq 0.5$, and
    said oxide semiconductor material has the formula R'$_m$Ba$_{3-m}$Cu$_3$O$_y$ where R' represents a rare earth element other than Pr, $1.3 \leq m \leq 1.5$, and $6.8 \leq y \leq 7.2$, and has a crystal structure identical with or similar to that of said oxide superconductor material.

2. A superconductive element as defined in claim 1, wherein the first and the second superconductive electrodes are formed being spaced apart from each other at a predetermined distance in a surface region of said semiconductor film, and a gate electrode is formed on an insulation film provided on the surface of said semiconductor film between said first and second superconductive electrodes.

3. A superconductive element as defined in claim 1, wherein R is La.

4. A superconductive element as defined in claim 1, wherein R is Nd.

5. A superconductive element as defined in claim 1, wherein the first superconductive electrode, the semiconductor film and the second superconductive electrode are laminated.

6. A superconductive element as defined in claim 5, wherein the oxide superconductor material is Y$_1$Ba$_2$Cu$_3$O$_{7-x}$ ($0 \leq X \leq 0.5$).

7. A superconductive element as defined in claim 5, wherein the oxide semiconductor material is composed of R$_m$Ba$_{3-m}$Cu$_3$O$_y$ (R represents a rare earth element other than Pr, $1.3 \leq m \leq 1.5$ and $6.8 \leq y \leq 7.2$).

8. A superconductive element as defined in claim 7, wherein R is La.

9. A superconductive element as defined in claim 7, wherein R is Nd.

10. A superconductive device comprising:
    first and second superconductive electrodes each composed of an oxide superconductor material and
    a semiconductor film composed of an oxide semiconductor material interposed in the current path between said first and second superconductive electrodes adjacent to said first and second superconductive electrodes, said current path defining a channel having a length between 0.1 and 1.0 microns, wherein
    said oxide superconductive material has the formula RBa$_2$Cu$_3$O$_{7-x}$ where R represents a rare earth element and $0 \leq x \leq 0.5$, and
    said oxide semiconductor material has the formula (R'$_n$Pr$_{1-n}$)$_m$Ba$_{3-m}$Cu$_3$O$_y$ where R' represents a rare earth element other than Pr, $0.3 \leq n \leq 0.4$, $1.3 \leq m \leq 1.5$, and $6.8 \leq y \leq 7.2$, and has a crystal structure similar to that of said oxide superconductor material.

11. A superconductive element as defined in claim 10, wherein R is Y or Nd.

12. A superconductive element as defined in claim 10, wherein the first and second superconductive electrodes are formed being spaced apart from each other within a surface region of said semiconductor film, and a gate electrode is formed by way of an insulation film on the surface of said semiconductor film between said first and second superconductive electrodes.

13. A superconductive element as defined in claim 10, wherein the first superconductive electrode, the semiconductor film and the second superconductive electrode are laminated.

* * * * *

UNITED STATES PATENT AND TRADEMARK OFFICE
CERTIFICATE OF CORRECTION

PATENT NO. : 5,250,506
DATED : 5 October 1993
INVENTOR(S) : Shinichiroh SAITOH et al.

It is certified that error appears in the above-indentified patent and that said Letters Patent is hereby corrected as shown below:

On the Title Page, Item [57];

IN THE ABSTRACT:  Line 6, change "in adjacent with" to --adjacent to--.
Line 11: change "amount" to --amounts--.
Line 12: change "amount" to --amounts--.
Line 13: change "no more" to --no longer--
Line 15: change "technic" to --techniques--.

| Column | Line | |
|---|---|---|
| 1 | 30 | Change "super current" to --supercurrent--. |
| 2 | 7 | After "Au" insert --,--. |

UNITED STATES PATENT AND TRADEMARK OFFICE
CERTIFICATE OF CORRECTION

PATENT NO. : 5,250,506
DATED : 5 October 1993
INVENTOR(S) : Shinichiroh SAITO et al.

It is certified that error appears in the above-indentified patent and that said Letters Patent is hereby corrected as shown below:

| Column | Line | |
|---|---|---|
| 2 | 67 | After "element" delete to end of line 68 and insert therefor --wherein there is no significant reduction of superconductive electron density.-- |
| 3 | 1 | After "objects," insert --there is provided--. |
| 3 | 11 | After "and" insert --do--. |
| 3 | 63 | Change "($0 \leq X \leq 0.5$)" to --($0 \leq x \leq 0.5$)--. |
| 3 | 68 | Change "100 nn" to --100 nm--. |
| 4 | 2 | Change "($0 \leq X \leq 0.5$)" to --($0 \leq x \leq 0.5$)--. |
| 4 | 41 | Change "($0 \leq X \leq 0.5$)" to --($0 \leq x \leq 0.5$)--. |
| 6 | 4 | Change "Aides" to --sides--. |
| 7 | 39 | Change "This" to --It--. |
| 9 | 31 | Change "to use" to --the use of--. |
| 9 | 32 | After "could" delete "not". |
| 9 | 42 | Change "face" to --phase--. |

UNITED STATES PATENT AND TRADEMARK OFFICE
CERTIFICATE OF CORRECTION

PATENT NO. : 5,250,506
DATED : 5 October 1993
INVENTOR(S) : Shinichiroh SAITOH et al.

It is certified that error appears in the above-indentified patent and that said Letters Patent is hereby corrected as shown below:

| Column | Line | |
|---|---|---|
| 9 | 56 | Change "with" to --for--. |
| 9 | 57 | Change "with" to --for--. |
| 10 | 5 | Change "$0 \leq X \leq 0.5$" to --$0 \leq x \leq 0.5$--. |
| 10 | 28 | Change "$(0 \leq X \leq 0.5)$" to --$(0 \leq x \leq 0.5)$--. |

Signed and Sealed this

Thirty-first Day of May, 1994

Attest:

BRUCE LEHMAN

Attesting Officer

Commissioner of Patents and Trademarks